United States Patent [19]

Namose

[11] Patent Number: 4,923,821
[45] Date of Patent: May 8, 1990

[54] FORMING TRENCH IN SEMICONDUCTOR SUBSTRATE WITH ROUNDED CORNERS

[75] Inventor: Isamu Namose, Nagano, Japan

[73] Assignee: Seiko Epson Corporation, Tokyo, Japan

[21] Appl. No.: 327,234

[22] Filed: Mar. 22, 1989

[30] Foreign Application Priority Data

Mar. 24, 1988 [JP] Japan ................................ 63-70222
Mar. 24, 1988 [JP] Japan ................................ 63-70221
Nov. 18, 1988 [JP] Japan ................................ 63-291520

[51] Int. Cl.$^5$ .................... H01L 21/265; H01L 21/76
[52] U.S. Cl. ........................................ 437/38; 437/67
[58] Field of Search .................... 437/38, 67; 156/643, 156/644

[56] References Cited

U.S. PATENT DOCUMENTS

| H204 | 2/1987 | Oh et al. | 156/648 |
| 4,200,968 | 5/1980 | Schroeder | 437/38 |
| 4,645,564 | 2/1987 | Morie et al. | 156/643 |
| 4,666,556 | 5/1987 | Fulton et al. | 156/643 |
| 4,693,781 | 9/1987 | Leung et al. | 156/643 |
| 4,735,824 | 4/1988 | Yamabe et al. | 427/79 |

FOREIGN PATENT DOCUMENTS

| 60-171760 | 9/1985 | Japan | 437/67 |
| 62-136065 | 6/1987 | Japan | 437/67 |

OTHER PUBLICATIONS

"A Variable-Size Shallow Trench Isolation (STI) Technology with Diffused Sidewall Doping for Submicron CMOS", IEEE Publication-IEDM 88, pp. 92-95, (1988).

Primary Examiner—Olik Chaudhuri
Attorney, Agent, or Firm—Spensley Horn Jubas & Lubitz

[57] ABSTRACT

After a semiconductor substrate is etched so as to form a groove and an impurity is introduced to the semiconductor substrate and to the groove, the corner portions of the groove are rounded by thermal oxidation of the semiconductor substrate, thereby forming a thermal oxide film on the corner portions, and an insulator is embedded in the groove, thereby forming an element isolating region.

5 Claims, 11 Drawing Sheets

FORMING TRENCH IN SEMICONDUCTOR SUBSTRATE WITH ROUNDED CORNERS

BACKGROUND OF THE INVENTION

1. Field of the Invention

The present invention relates to a method of manufacturing a semiconductor device and, more particularly, to a method of forming an element isolating region and a well region in such a device.

2. Description of the Prior Art

An element isolating method of the "groove isolation type", in which a groove is formed on the surface of the semiconductor substrate to embed an insulator therein, has conventionally been investigated in order to make a semiconductor device smaller and to enhance the reliability thereof. Examples of such a method are disclosed in Japanese Patent Laid-Open Nos. 124949/1985, 61430/1986 and 168241/1986.

In an element isolating region which is formed by such a conventional method, however, when a thermal oxide film is formed as in the process of forming a gate insulation film, the thickness of the oxide film becomes less at the upper corner of the groove than that at the flat portion, as shown in FIG. 6(a), which shows a semiconductor substrate 101 provided with an element isolating region 102, with a thermal oxide film 111 formed thereon. The reduced thickness region is circled. This unfavorable phenomenon is produced because the oxidation rate is lowered at a convex or concave portion of the silicon surface of the groove which is provided on the semiconductor substrate for forming an element isolating region 102 due to the stress concentration which is produced at the time of thermal oxidation. The smaller the curvature radius of the convex or concave portion is, the greater is the stress concentration and, hence, the greater is the degree to which the thermal oxide film at a concave or convex portion becomes thinner than that at the flat portion. Further, since an electric field concentration, due to the three dimensional configuration, is caused at the convex and the concave portions, the Fowler-Nordheim current greatly increases there, thereby deteriorating the insulating property of the oxide film. In element isolation, this phenomenon corresponds to the phenomenon which is produced when two transistors having gate insulation films of different thicknesses are connected in parallel. More specifically, referring to FIGS. 7(a) and 7(b), a hump is disadvantageously produced in Vgs-Ids characteristic 603 shown in FIG. 7(b) as the synthesis of the tail characteristics 601 and 602 of transistors shown in FIG. 7(a). In FIGS. 7(a) and 7(b), the reference numeral 601 shows the tail characteristic of a transistor formed at the flat portion, 602 the tail characteristic of a transistor formed at the corner portion, and 603 the combination of the tail characteristics of 601 and 602.

In order to eliminate these problems, Japanese Patent Laid-Open Nos. 45848/1988 and 276226/1986, for example, propose a rounding treatment of the convex and concave portions by thermal oxidation for mitigating the concentration of the electric field there. As is known, if a gate insulation film is formed after this treatment, it is possible to obtain a gate insulation film having a more uniform thickness, such as that shown in FIG. 6(b).

In other words, it is now common knowledge that this technique is required in order to put an element isolating region of a groove isolation type to practical use.

Accordingly, a method of manufacturing a semiconductor device is composed of the steps of forming a well region, implanting a channel stopper in a groove, rounding the convex and concave portions, embedding an insulator in the groove and forming a transistor and wiring. For example, a known semiconductor device is manufactured in such a manner as shown in FIGS. 5(a) to 5(g), by carrying out the following steps in the order listed:

1. P Well photolithography
2. P Well ion implantation
3. N Well photolithography
4. N Well Ion implantation
5. Drive in (activation)
6. $SiO_2$ deposition
7. Photolithography for groove isolation
8. $SiO_2$ etching
9. Etching for groove isolation
10. Channel stopper photolithography
11. Channel stopper ion isolation
12. Rounding oxide treatment
13. $SiO_2$ deposition
14. $SiO_2$ etching
15. Gate insulation film forming More specifically, a method of manufacturing a semiconductor device having a CMOS structure will be explained.

In FIGS. 5, a semiconductor substrate 101 consisting of N-type silicon or the like, is to be provided with an element isolating region 102, a P well 105, a channel stopper 112, an N well 115, photoresist layers 116a-d, phosphorus (P) doping 118 and boron (B) doping 120, with the aid of ion beams 117 and 119, thermal oxide films 121a and b, and a CVD oxide film 122.

The wells 105 and 115 are first formed in order to form P and N channels, respectively (FIGS. (5a) to 5(c)). The wells are formed to a depth of several $\mu$m by thermal treatment. Phosphorus doping 118 and boron doping 120 are effecting by ion implantation and wells 105 and 115 are then formed.

On the semiconductor substrate 101 with the wells 105 and 115 formed thereon, the CVD oxide film 122, such as a silicon oxide film, is formed. The semiconductor substrate 101 and the CVD oxide film 122 are etched to form grooves while using the photoresist 116c as a mask (FIG. 5(d)). Etching of the CVD oxide film 122 is necessary for forming the channel stoppers 112 only in the grooves at the next step.

The channel stoppers 112 are then formed in the grooves of the P well 105 by ion implantation using the CVD oxide film 122 and a new photoresist layer 116d as a mask.

Thereafter, the photoresist layer 116d and the CVD oxide film 122 are removed by etching (FIGS. 5(e) to 5(f)). As a rounding treatment, the semiconductor substrate is oxidized to a depth of 1500 Å at a temperature of 1150° C. in a 10% oxygen atmosphere. The P well 105 becomes 1.5 to 2 times deeper by this heat treatment.

A new CVD silicon oxide film is then formed and etched back so as to form element isolating regions 102 with the insulator embedded therein (FIG. 5(g)).

A transistor, wiring, and a protective film are then formed, if necessary, thereby completing the semiconductor device. FIG. 4 shows one embodiment of a semiconductor device produced on the structure of FIG.

5(g). In FIG. 4, the reference numerals indicate the same elements as in FIGS. 1, 5 and 6.

The above-described conventional technique, however, has the following problems.

After the grooves are formed, the substrate is oxidized to a thickness of not less than 1500 Å at a temperature of 1150° C. in an oxygen atmosphere so as to round the upper corners of the grooves and prevent the deterioration of the element characteristics such as deterioration of the gate breakdown characteristics and hump of the tail characteristic which are caused by the concentration of electric field on the corners of the gate ends of the semiconductor device.

At this time, since the impurity density of the surface of the semiconductor substrate is lowered by the oxidation, because the portion of the surface of the substrate of silicon or the like at which the density of the impurities is high becomes an oxide, the threshold voltages of the field (parasitic) MOS transistors (FIG. 4: 130, 140 and 150) which are formed in the element isolating regions are lowered too much to obtain a sufficient capacitance. Especially, the surface density of the field MOS transistor 150 under the element isolating region of the P well is lowered, so that a current leakage is produced between the wells by the inversion of the field. This phenomenon is produced when boron, which is an impurity, is mixed with the oxide film during the oxidation. The threshold voltage of the field MOS transistor which is formed in the element isolating region is generally raised by forming a channel stopper in the groove of the P well by implanting boron ions only in the groove. In this case, however, since the channel stopper is diffused to the surface of the substrate, the threshold voltage of the transistor in the element forming region is disadvantageously raised. Since this phenomenon is prominent at the boundary of the element isolating region and the surface of the substrate, the threshold voltage of the transistor is undesirably dependent on the width of the channel. This result is generally called a narrow channel effect, which deteriorates the characteristics of the element.

Since it is impossible to reduce the depth of the well, the channel stopper also is diffused in the transverse direction, so that almost double the distance between the wells is required.

SUMMARY OF THE INVENTION

Accordingly, it is an object of the present invention to eliminate the above-described problems in the prior art and to provide a method of manufacturing a semiconductor device which prevents the deterioration of element characteristics, such as deterioration of the gate breakdown characteristics and hump of the tail characteristic caused by the concentration of electric field on the corners of the gate ends of the semiconductor device, a current leakage between the wells and the production of a narrow channel effect, and which enables the field MOS transistor in an element isolating region to have a sufficient threshold voltage, the distance between the wells to be reduced to about half, and the number of manufacturing steps to be reduced.

To achieve these objects, the present invention provides a method of manufacturing a semiconductor device having an element isolating region formed by embedding an insulator in a groove provided in a semiconductor substrate, the method comprising the steps of: (a) selectively etching the semiconductor substrate so as to form a groove; (b) selectively introducing an impurity to the surface of the semiconductor substrate and to the bottom of the groove provided therein; (c) rounding the corner portions at at least the upper and lower portions of the groove by thermal oxidation of the semiconductor substrate with the impurity introduced thereto and the groove provided therein, thereby forming a thermal oxide film on the corner portions; and (d) embedding the insulator in the groove with the corner portions rounded, thereby forming the element isolating region.

According to the method of the present invention, since the activating of the well, which is formed by implanting the impurity in the substrate and the groove which is to constitute an element isolating region, by thermal diffusion, and the rounding of the upper corner portions of the groove in the element isolating region by thermal oxidation are combined together, the profile of the impurity density of the substrate under the element isolating region is the same as that of the substrate in the element forming region. Therefore, as compared with a conventional device in which the impurity density of the surface of the substrate under the element isolating region is lowered, the field MOS transistor according to the invention has, in the element isolating region, a sufficient threshold voltage. In other words, the inversion of the field, which is unfavorable for a semiconductor device, is not produced in the present invention.

If the substrate is oxidized to a thickness of not less than 500 Å at a temperature of 1050° C. in an oxygen gas atmosphere or in a nitrogen gas atmosphere which contains oxygen gas, it is possible to obtain highly reliable characteristics of the element and the element isolating region which are free from deterioration of the element characteristics, such as deterioration of the gate breakdown characteristics and hump of the tail characteristic which are caused by the concentration of electric field on the corners of the gate ends of the semiconductor device.

According to the present invention, since the field MOS transistor in the element isolating region has a sufficient threshold voltage and the time for thermal treatment is reduced to less than half of that conventionally required, an inversion region is unlikely to be produced at the groove bottom of a well, especially the P well, thereby preventing a current leakage. In the present invention, since it is possible to make a shallow well, it is possible to reduce the size of an element isolating region in the direction between adjacent wells, or to reduce the separation between wells at the surface of the substrate. In fact, this separation can be reduced to less than one-half that required in conventional devices.

The above and other objects, features and advantages of the present invention will become clear from the following description of the preferred embodiments thereof, taken in conjunction with the accompanying drawings.

DESCRIPTION OF THE PREFERRED EMBODIMENTS

Figure 1:
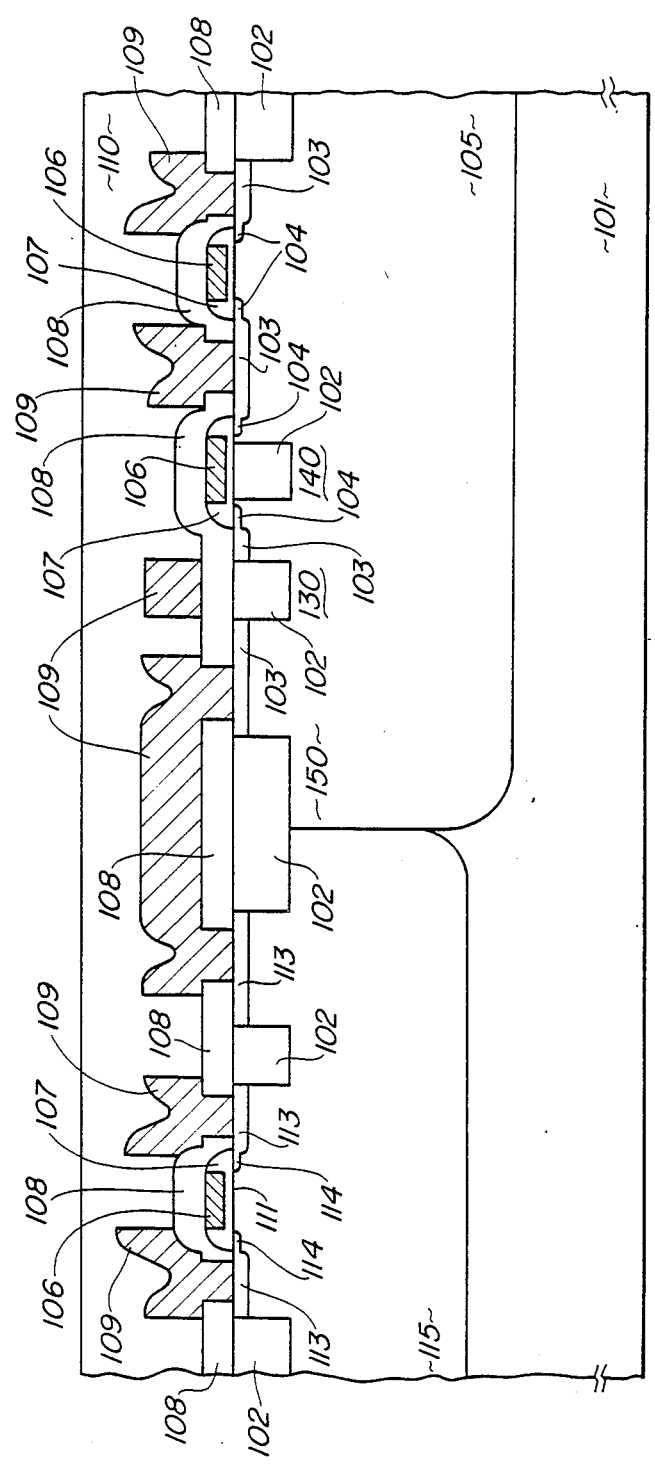
FIG. 1 is a cross-sectional view of the main part of an exemplary semiconductor device produced in accordance with the present invention.

FIG. 1 is a sectional view of the main part of an example of a semiconductor device in accordance with the present invention. A semiconductor substrate 101 consisting of N-type silicon contains element isolating regions 102, an N well 115 and a P well 105. Substrate 101 is further provided with an N+diffusion layer 103 and an N−diffusion layer 104, gate electrodes 106, side walls 107, gate insulation films 111, a P+diffusion layer 113 and a P−diffusion layer 114. The reference numeral 108 denotes an interlayer insulation film, 109 a wiring, or contacts, consisting of Al, Al-Si, Al-Si-Cu, a refractory metal, or the like, and 110 a protective film. The reference numeral 130 represents a field MOS transistor which is formed under the wiring 109, 140 a field MOS transistor which is formed under the gate electrode 106, and 150 a field MOS transistor which is formed under the wiring 109 and astride the wells 115 and 105.

FIGS. 2(a) to 2(f) are sectional views of the main steps of an embodiment of a method of manufacturing such a semiconductor device according to the present invention. The steps necessary for the formation of the element isolating region will be explained hereinunder. In order to realize an MOS LSI, it is necessary to add thereafter necessary steps which are commonly known.

Figure 2A:
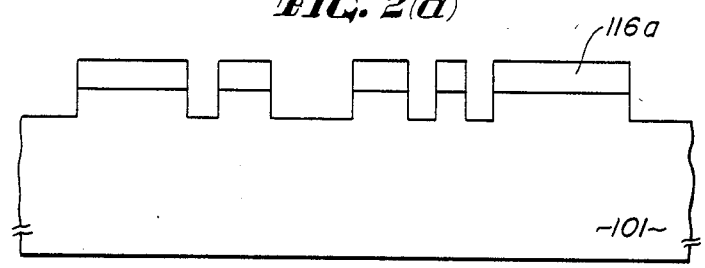
FIGS. 2(a) to 2(f) are cross-sectional views showing the main steps of an embodiment of a method of manufacturing a semiconductor device according to the present invention.

As shown in FIG. 2(a), grooves are first formed on the silicon substrate 101 of a first conductivity type, for example N-type, while using a photoresist 116a, for example, as a mask, by anisotropic etching such as RIE (Reactive Ion Etching). For example, grooves of 0.8 μm depth are formed by using $CBrF_3$ gas at 400 mTorr. The etching gas is naturally not restricted thereto and any gas that is capable of anisotropically etching silicon, such as chlorine gas, is usable. As a mask used for etching the silicon substrate, an oxide film and a nitride film are also usable as well as the photoresist 116a.

Figure 2B:
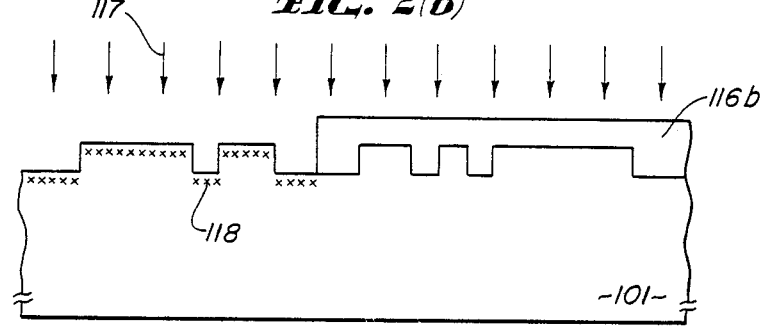
Figure 2C:
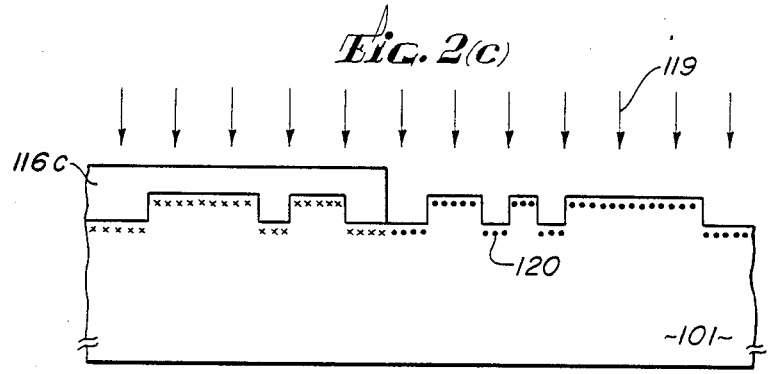

The photoresist 116a is then removed, and thereafter as an impurity of the first conductivity type which is the same as the silicon substrate, ions of phosphorus 118, for example, are implanted at 120 KeV at a dosage of 2E13 (/cm$^2$) and then as an impurity of a second conductivity type, ions of boron 120, for example, are implanted at 80 KeV at a dosage of 1E13 (/cm$^2$) by ion beams 117 and 119, respectively, while using resists 116b and 116c, respectively, as masks shown in FIGS. 2(b) and 2(c). Although an N-type silicon substrate 101 is used, a P-type silicon substrate may naturally be used instead. The first and second impurities are not restricted to the above elements, and the order of implantation is not restricted either. Impurities are generally implanted by using a resist as a mask.

Figure 2D:
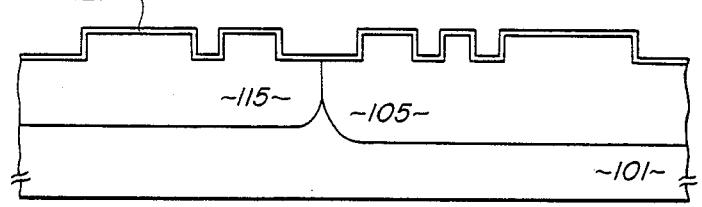

The substrate 101 is next subjected to rounding treatment by oxidation in order to round the corner portions of the grooves, which are to constitute element isolating regions, as shown in FIG. 2(d). The rounding treatment by oxidation utilizes the fact that when silicon or the like at the corner portion is thermally oxidized, the curvature radius of the corner portion is enlarged. The silicon substrate 101 is oxidized at a temperature of 1150° C., for example, for about 5 hours, for example, in a nitrogen gas atmosphere which contains, for example, 20% oxygen gas, thereby forming a thermal oxide film 121a having a thickness of 1500 Å. This thermal oxide film 121a is an oxide film obtained by the oxidation rounding treatment. The oxidation conditions are not restricted to the above conditions.

Figure 10:
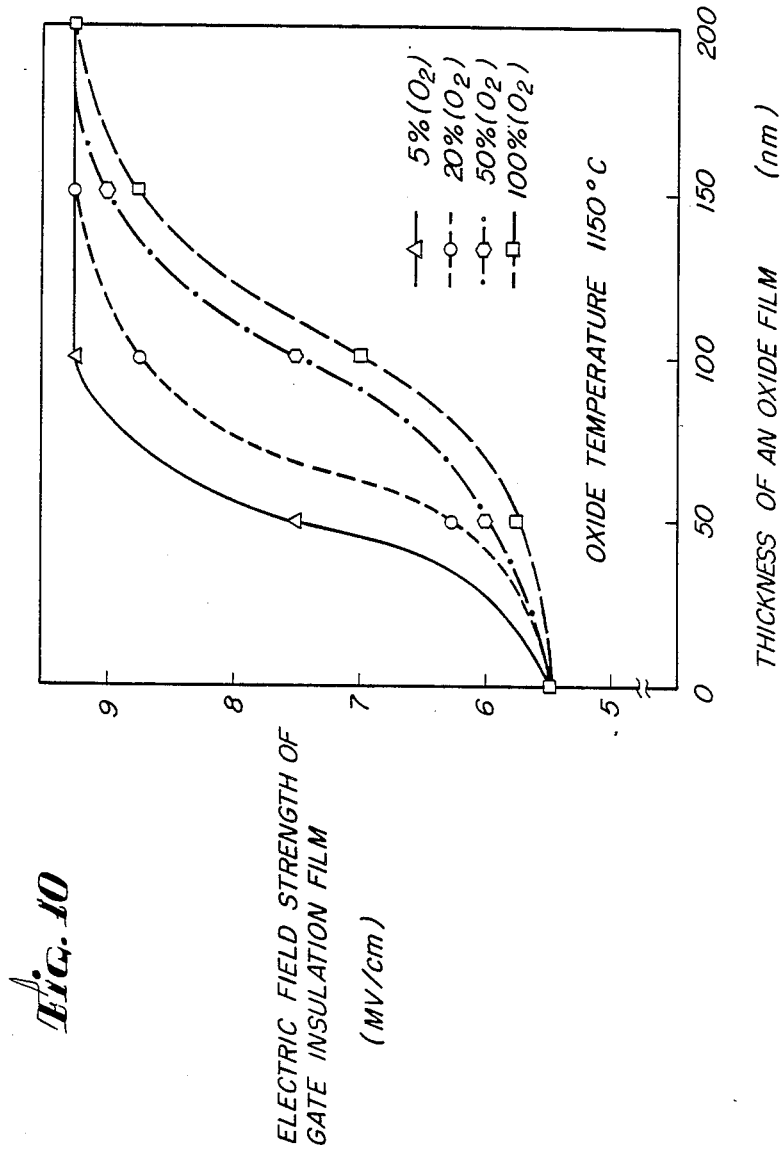
FIG. 10 illustrates the relationship between the thickness of an oxide film for rounding treatment and the electric field strength of the gate insulation
Figure 11:
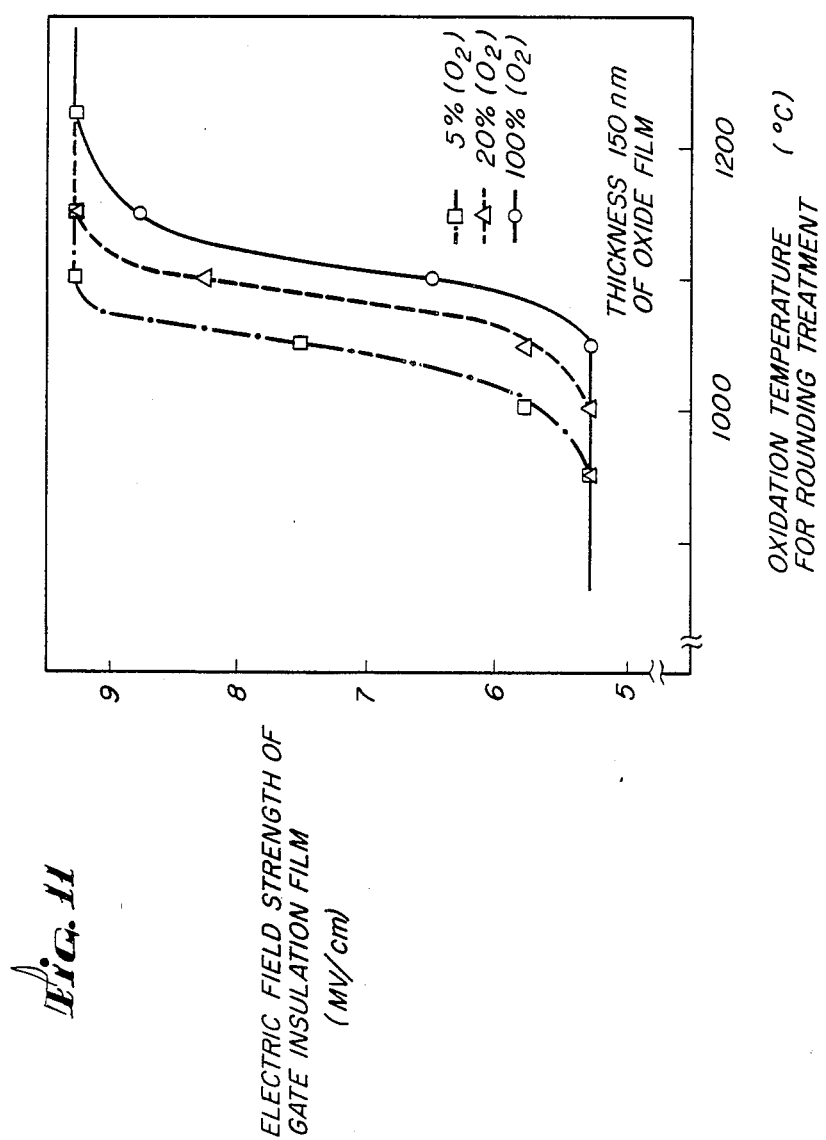
FIG. 11 illustrates the relationship between the oxidation temperature for rounding treatment and the electric field strength of the gate insulation film.

In the graphs of FIGS. 10 and 11, the breakdown of a gate insulation film 111 200 Å thick which is formed after the rounding treatment is represented by the electric field strength. In FIG. 10, the ratio of oxygen gas to the total gas in the atmosphere for the thermal oxidation of silicon or the like of the semiconductor substrate is varied among 5%, 20%, 50% and 100%, and the relationship between the thickness of the oxide film 121a and the field strength of the gate insulation film 111 is shown. As is obvious from FIG. 10, if the thickness of the oxide film formed by the rounding treatment is preferably not less than 50 nm (500 Å), more preferably not less than 100 nm (1000 Å), it is possible to maintain a good electric field strength for the breakdown of the gate insulation film.

In FIG. 11, the ratio of oxygen gas to the total gas in the atmosphere for forming an oxide film 150 nm (1500 Å) thick from silicon or the like of the semiconductor substrate is varied among 5%, 20% and 100%, and the relationship between the oxidizing temperature and the electric field strength of the gate insulation film is shown. As is obvious from FIG. 11, if the temperature for the rounding treatment is preferably not lower than 1050° C., more preferably not lower than 1100° C., it is possible to maintain a good electric field strength for the breakdown of the gate insulation film.

It is clear from these graphs that the field strength of the gate insulation film is improved by oxidizing the substrate 101 to a thickness of preferably not less than 500 Å at a temperature of preferably not lower than 1050° C. in an oxygen gas atmosphere or a nitrogen gas atmosphere containing oxygen gas. Simultaneously with this rounding treatment, the impurity of the first conductivity type phosphorus 118 and the impurity of the second conductivity type boron 120 are diffused; in other words, the impurities are activated by heat, so as to form the wells 115 and 105. The impurity density profiles of the wells are shown in FIGS. 8 and 9, wherein FIG. 8 shows the impurity density with respect to the depth of the P well and FIG. 9 shows the impurity density with respect to the depth of the N well.

Figure 8:
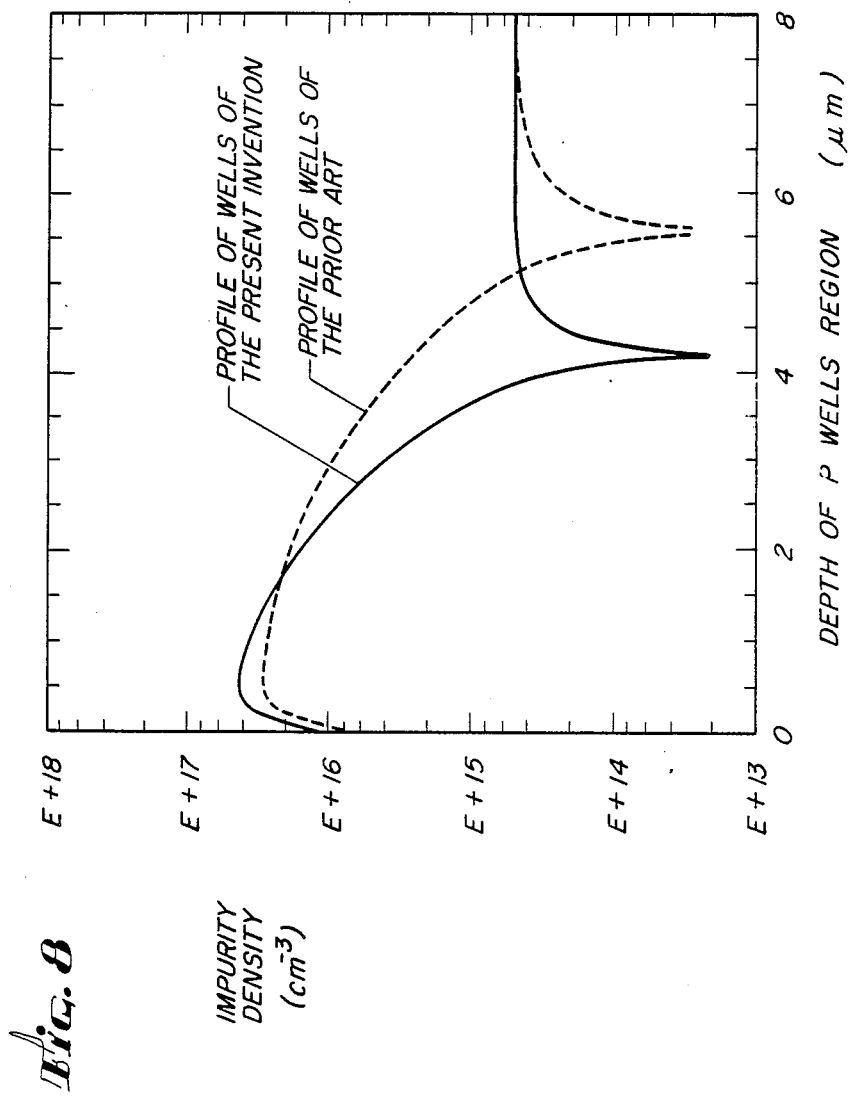
FIG. 8 illustrates the profiles of the concentrations of P wells of semiconductor devices of the present invention and in the prior art, respectively.
Figure 9:
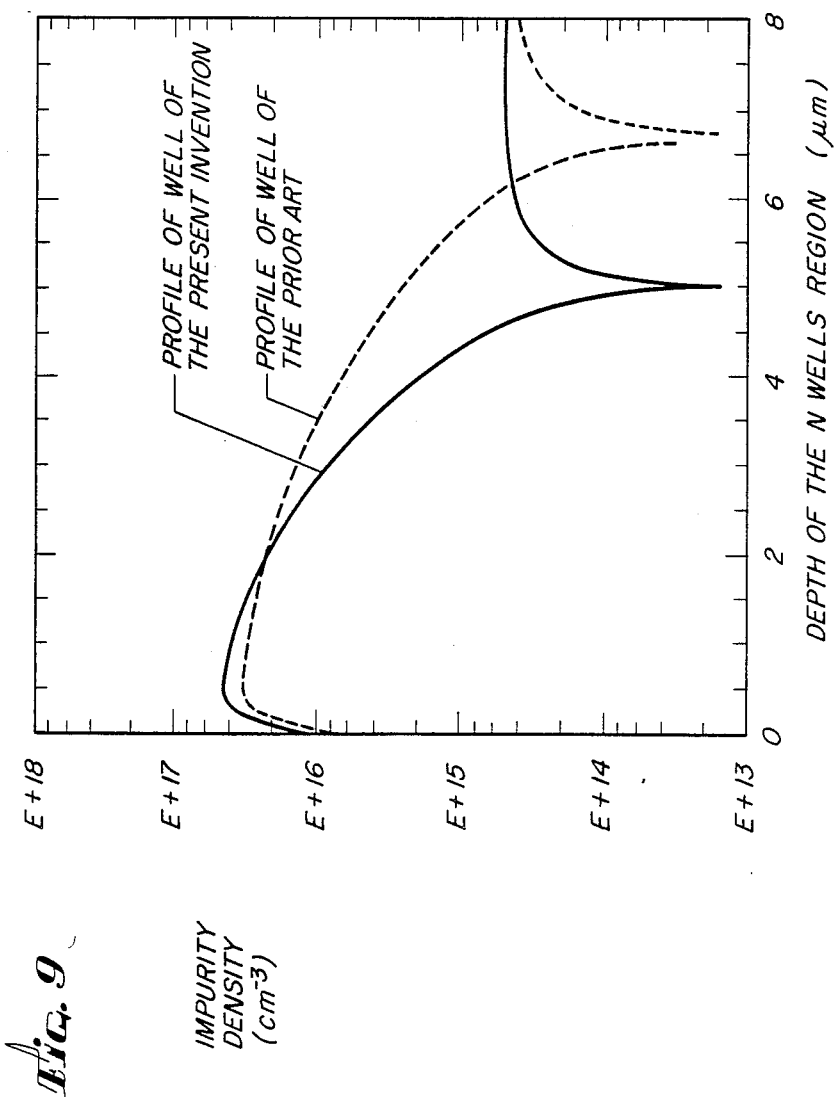
FIG. 9 illustrates the profiles of the concentrations of N wells of semiconductor devices of the present invention and in the prior art, respectively.

It is clear from FIGS. 8 and 9 that according to the present invention, the impurity concentration on the surface of the semiconductor substrate which contains the element isolating regions is higher than that in the prior art. That is, according to the present invention, the field MOS transistor in an element isolating region has a sufficient threshold voltage to prevent inversion of the field, which is unfavorable for a semiconductor device.

The thermal oxide film 121a formed by the rounding treatment conducted in order to improve the electric field strength of the gate insulation film, as shown in FIG. 2(d), may be either removed by etching immediately after the formation thereof or left in place. When the thermal oxide film 121a is not removed immediately after the formation, it is generally removed by etching before the gate insulation film is formed from the thermal oxide film. When the thermal oxide film 121a which contains contamination and the like is removed by etching, a clean gate insulation film is formed on the surface of the substrate.

Figure 2E:
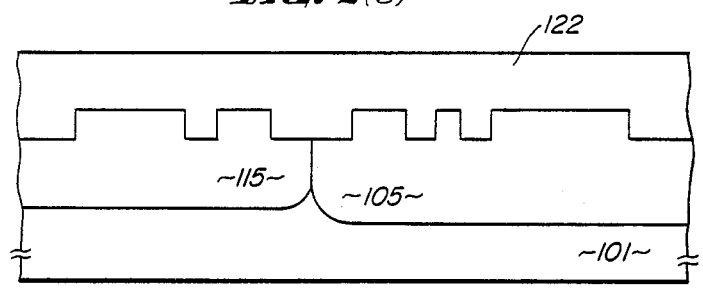
Figure 2F:
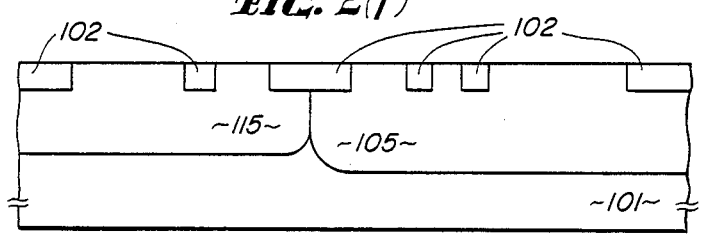

Referring to FIG. 2(e), a CVD oxide and/or W silicon nitride film 122 is then formed on the surface of the silicon substrate 101 and in the grooves as an insulation film having a thickness greater than the depth of the grooves. Film 122 is subjected to anisotropic etching, such as RIE using $CHF_3$ gas, in a manner to leave the film material in the grooves, as shown in FIG. 2(f), so that element isolating regions 102 are formed. Alternatively, a method which may be used for forming a CVD oxide film on the surface of the silicon substrate 101 as an insulation film having a thickness larger than the depth of the grooves, is carried out by applying a polymer resin film to the CVD oxide film, and leaving a CVD oxide film in the grooves by RIE using etching gases having an equal etching rate for the polymer resin film and the CVD oxide film, e.g., $CHF_3$ gas and oxygen gas. This method permits the surface of the insulation film in the element isolating regions to be made smoother. As the polymer resin film, a photoresist film, for example, is usable. Especially, a film having a good evenness is preferable. The method of embedding an insulator in the grooves is not restricted to the above-described methods and various other methods, such as a method of embedding polycrystalline silicon in the grooves and then converting the polycrystalline silicon to a silicon oxide by thermal oxidation, are usable.

When an MOS LSI is formed thereafter, the subsequent steps are performed after the formation of the gate insulation film.

Figure 3A:
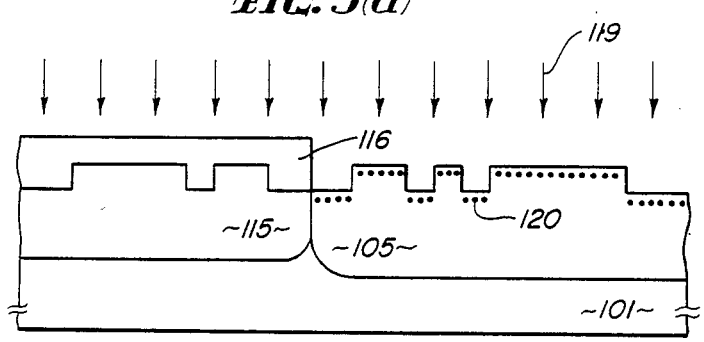
FIGS. 3(a) and 3(b) are cross-sectional views showing the main steps of a modification of the embodiment shown in FIGS. 2(a) to 2(f).
Figure 3B:
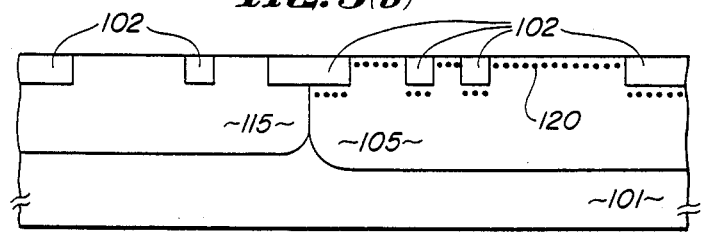

It will be understood that in this embodiment, since impurities for forming the wells after the formation of the grooves for the element isolating regions have been introduced, the profile of the impurity density of the substrate under the element isolating regions is the same as the profile of the impurity density of the substrate in the element forming regions. In the case where the inverse voltage of the field MOS transistor on the N channel side is lowered depending upon the impurity density of the well, the inverse voltage is adjusted by further introducing into P well 105 boron 120 as the impurity of the same conductivity type as the P well 105, as shown in FIGS. 3(a) and 3(b), after the P well has been formed simultaneously with the rounding treatment.

Accordingly, in this embodiment, the field MOS transistor has a sufficient threshold voltage in the element isolating region, so that a current leakage is unlikely to occur between the wells, as compared with a conventional device in which the impurity density of the substrate under the element isolating region is lowered.

Furthermore, since the impurities for forming wells are introduced after the grooves for element isolating regions are formed in this embodiment, the profile of the impurity density of the substrate under the element isolating regions is the same as the profile of the impurity density of the substrate in the element forming regions, so that the step of introducing an impurity for forming a stopper region, which is necessary in the prior art, can be fundamentally omitted. If the well must have a certain impurity density, however, it is necessary to further introduce an impurity, especially, on the N channel side, as shown in FIGS. 3(a) and 3(b).

Although this embodiment is described with reference to a semiconductor device having a CMOS structure, the present invention is not restricted thereto. In order to form a single channel, only a single well is formed. It goes without saying that the present invention is also adaptable to a bipolar device and a BICMOS device.

In this embodiment, it is possible to obtain the highly reliable characteristics of the element and the element isolating regions which are free from deterioration of the element characteristics such as deterioration of the gate breakdown characteristics and hump of the tail characteristic which are caused by the concentration of electric field at the corners of the gate ends of the semiconductor device.

In addition, the present invention is capable of greatly reducing the number of manufacturing steps as compared with the prior art. Thus, in contrast to the sequence of steps characterizing the prior art and listed earlier herein, a method according to the present invention can be summarized as follows:

1. Photolithography for groove isolation
2. Etching for groove isolation
3. P Well photolithography
4. P Well implantation
5. N Well photolithography
6. N Well ion implantation
7. Rounding oxide treatment (NCD photolithography) (NCD ion implantation)
8. $SiO_2$ deposition
9. $SiO_2$ etching
10. Gate insulation film forming As described above, according to the present invention, since the procedures for thermal diffusion of a well and for rounding the upper corner portions of the grooves in the element isolating regions by thermal oxidation are combined together, there is no possibility of lowering the impurity density of the bottom portion of the grooves. Therefore, the profile of the impurity density under the element isolating regions formed is the same as that in the element forming regions. Thus, according to the present invention, the field MOS transistor in the element isolating regions has a sufficient threshold voltage as compared with a conventional device in which the impurity density of the substrate under the element isolating regions is lowered, and it is possible to obtain a transistor which is unlikely to produce a current leakage, especially, between the wells. At the corners of the gate ends of the semiconductor device, it is possible to obtain highly reliable characteristics of an element and element isolation region which are free from the deterioration of the element characteristics such as deterioration of the gate breakdown characteristics and hump of the tail characteristic caused by the concentration of electric field thereon.

Figure 4:
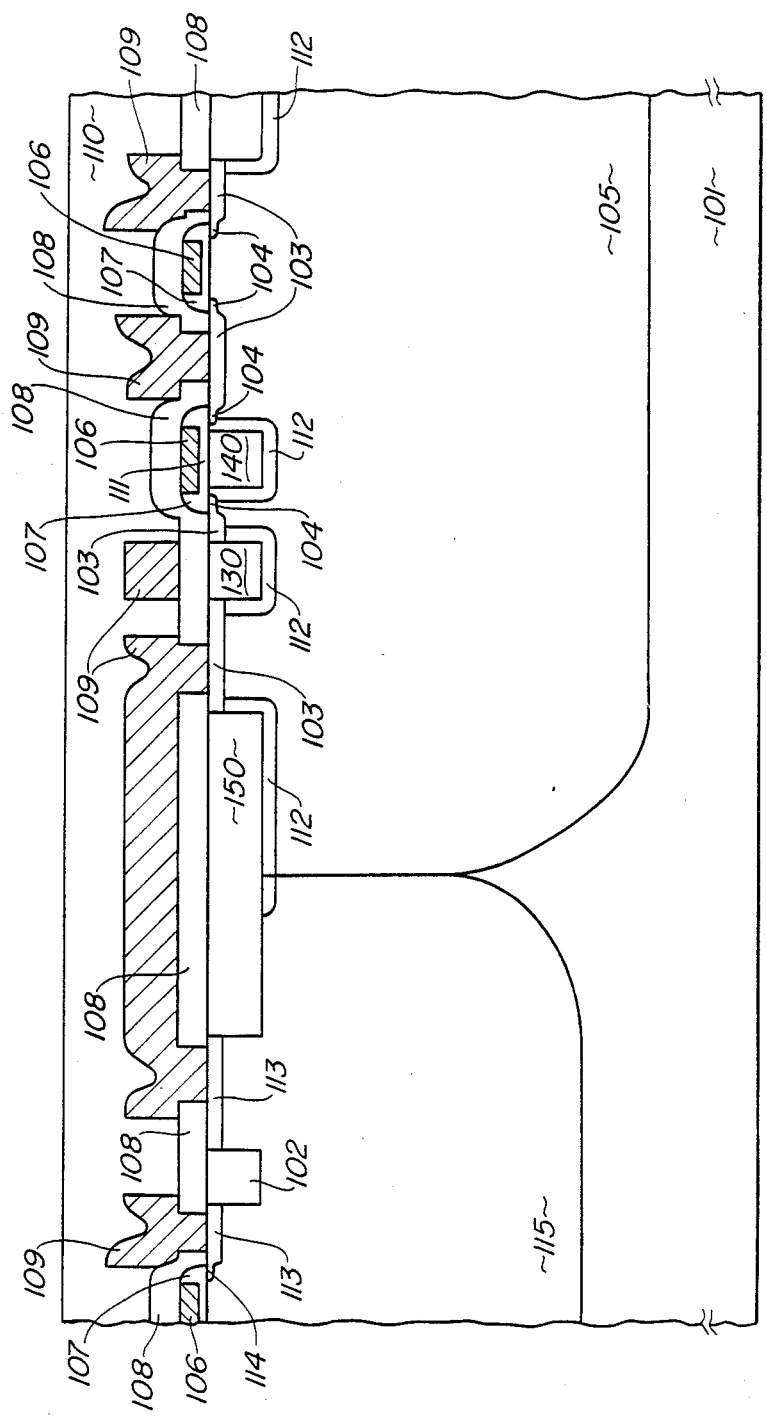
FIG. 4 is a cross-sectional view of the main part of a conventional semiconductor device.
Figure 5A:
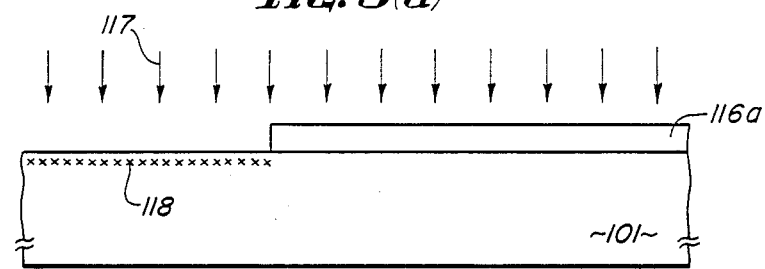
FIG. 5(a) to 5(g) are cross-sectional views of the main steps of a conventional method of manufacturing a semiconductor device.
Figure 5B:
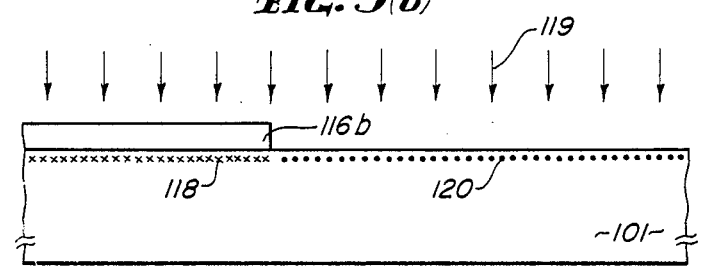
Figure 5C:
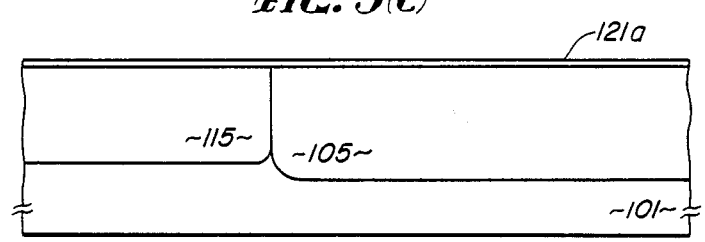
Figure 5D:
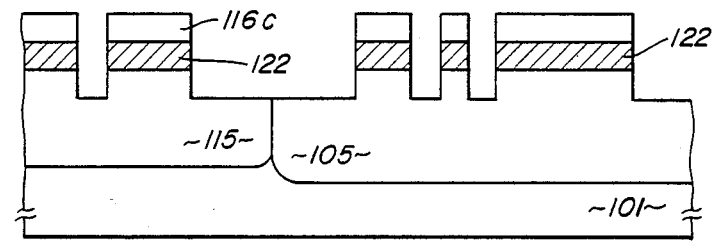
Figure 5E:
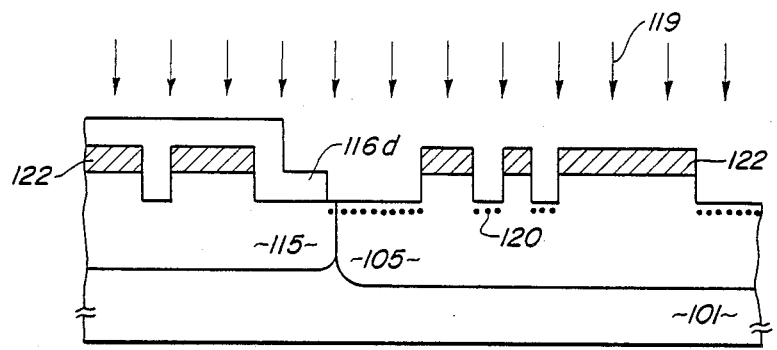
Figure 5F:
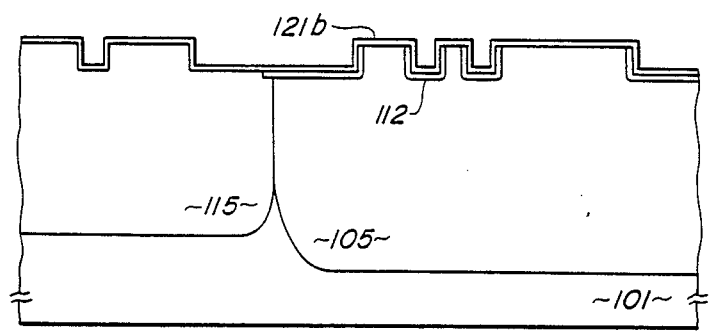
Figure 5G:
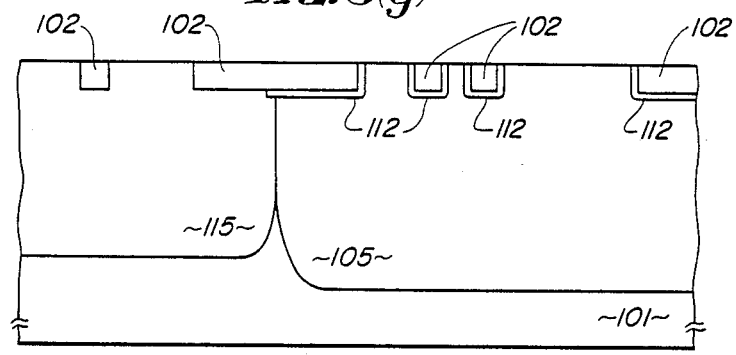
Figure 6A:
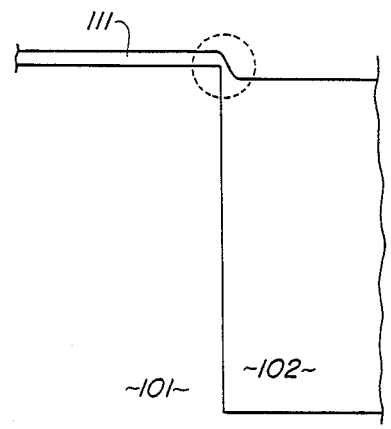
FIG. 6(a) is a pictorial view illustrating a gate after oxidation which has not been subjected to a rounding treatment by oxidation.
Figure 6B:
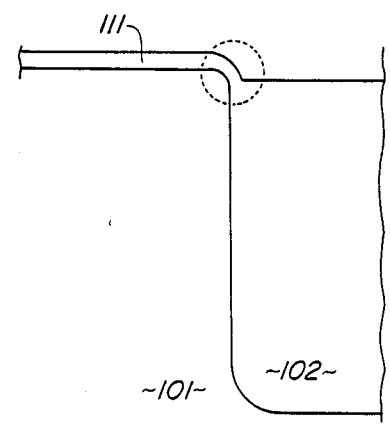
FIG. 6(b) is a similar view of the gate, after oxidation, which has been subjected to rounding treatment by oxidation.
Figure 7A:
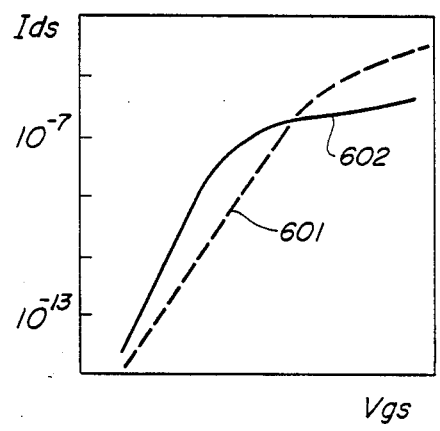
FIGS. 7(a) and 7(b) show curves illustrating the tail characteristic of a transistor which is dependent on whether or not the substrate has been subjected to rounding treatment by oxidation.
Figure 7B:
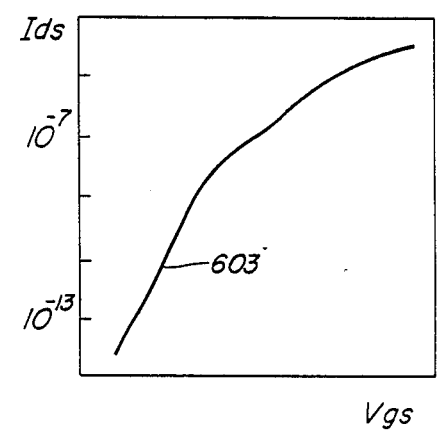

One result of the manufacturing technique according to the invention is that the width of the element isolating region 102 in FIG. 1 which straddles wells 105 and 115 can be substantially reduced. As shown in FIGS. 1 and 4, the width of this region in a device according to the present invention is less than one-half of the width in a conventional device. This, in turn, allows the spacing between adjacent semiconductor devices to be reduced and thus makes possible a higher degree of integration.

In addition, since it is possible to greatly reduce the number of steps for manufacturing a semiconductor device, the yield is enhanced and the manufacturing cost is reduced.

It will thus be seen that in accordance with the present invention, after a semiconductor substrate is etched to form grooves, the necessary well ion implantation is performed. In this process, the ion implantation is carried out so as to introduce the impurity to the surface of the substrate and the bottom of the grooves. Then, the activation process is carried out at the same time as the rounding process which involves formation of an oxide layer. The activation and corner rounding operation should be performed at a higher temperature, preferably above 1100° C., and in a more diluted $O_2$ atmosphere. It is preferred that the substrate be oxidized to a depth of more than 1000 Å. After activation of the well, when a current leakage is produced between adjacent wells by a field inversion, $V_{th}$ of the resulting transistor is set by implanting impurity at the bottom of the groove and on the surface of the substrate. This process may be performed if the impurity density of the well is initially not sufficiently high. Thereafter, impurity is introduced to the grooves and transistors are formed.

This application relates to subject matter disclosed in Japanese Applications Nos. 70221/88, filed on Mar. 24, 1988; 70222/88, filed on Mar. 24, 1988, and 291520/88; filed on Nov. 18, 1988, the disclosures of which are incorporated herein by reference.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A method of manufacturing a semiconductor device having an element isolating region formed by embedding an insulator in a groove provided in a semiconductor substrate, said method comprising the steps of:
   (a) selectively etching a semiconductor substrate to form a groove therein;
   (b) selectively introducing an impurity to said semiconductor substrate around said groove and into the bottom of said groove provided therein;
   (c) rounding the corner portions at at least the upper and lower portions of said groove by thermal oxidation of said semiconductor substrate after said step of introducing, thereby forming a thermal oxide film on the surface of said semiconductor substrate with said corner portions;
   (d) activating the impurity introduced to said substrate and into the bottom of said groove so as to form a well region simultaneously with said step of rounding; and
   (e) embedding an insulator in said groove with said corner portions rounded, thereby forming an element isolating region.

2. A method of manufacturing a semiconductor device according to claim 1 wherein the temperature at which thermal oxidation is performed in said rounding step is more than about 1050° C., and the thickness of said thermal oxide film is more than about 500 Å.

3. A method of manufacturing a semiconductor device according to claim 1, wherein said semiconductor substrate is of a first conductivity type, and said impurity introduced to said semiconductor substrate is of a second conductivity type, which is the opposite to said first conductivity type.

4. A method of manufacturing a semiconductor device having element isolating regions formed by embedding an insulator in grooves provided in a semiconductor substrate, said method comprising the steps of:
   (a) selectively etching a first region and a second region of a semiconductor substrate so as to form at least one groove in each region;
   (b) introducing a first impurity of a first conductivity type to said first region of said semiconductor substrate around said groove and into the bottom of said groove provided in said first region and introducing a second impurity of a second conductivity type to said second region of said semiconductor substrate around said groove and into the bottom of said groove provided in said second region;
   (c) rounding the corner portions at at least the upper and lower portions of said grooves by thermal oxidation of said semiconductor substrate after said step of introducing, thereby forming a thermal oxide film on the surface of said semiconductor substrate with said corner portions;
   (d) activating the first and second impurities introduced to said semiconductor substrate so as to form a first well region and a second well region, respectively, simultaneously with said step of rounding; and
   (e) embedding an insulator in said grooves with said corner portions rounded, thereby forming element isolating regions.

5. A method of manufacturing a semiconductor device according to claim 4 wherein the temperature at which thermal oxidation is performed in said rounding step is more than about 1050° C., and the thickness of said thermal oxide film is more than about 500 Å.

* * * * *